(12) United States Patent
Zhang et al.

(10) Patent No.: US 11,315,908 B2
(45) Date of Patent: Apr. 26, 2022

(54) LED PACKAGE STRUCTURE HAVING IMPROVED BRIGHTNESS

(71) Applicant: KAISTAR Lighting(Xiamen) Co., Ltd., Xiamen (CN)

(72) Inventors: Jing-Qiong Zhang, Xiamen (CN); Tsung-Chieh Lin, Xiamen (CN)

(73) Assignee: KAISTAR LIGHTING(XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/442,727

(22) Filed: Jun. 17, 2019

(65) Prior Publication Data

US 2019/0319016 A1 Oct. 17, 2019

(30) Foreign Application Priority Data

Aug. 28, 2018 (CN) .......................... 201810989330.6

(51) Int. Cl.
*H01L 25/07* (2006.01)
*H01L 25/075* (2006.01)
*H01L 33/50* (2010.01)
*H01L 33/52* (2010.01)
*H01L 33/62* (2010.01)

(52) U.S. Cl.
CPC ........ *H01L 25/0753* (2013.01); *H01L 33/505* (2013.01); *H01L 33/52* (2013.01); *H01L 33/62* (2013.01)

(58) Field of Classification Search
CPC ... H01L 25/0753; H01L 33/50; H01L 33/502; H01L 25/167; H01L 2219/037
USPC ........................................ 257/89; 438/22, 28
See application file for complete search history.

(56) References Cited

U.S. PATENT DOCUMENTS

| | | | | |
|---|---|---|---|---|
| 2012/0155076 A1* | 6/2012 | Li | ............... | H05B 45/22 362/231 |
| 2014/0319553 A1* | 10/2014 | Ye | ............... | H01L 33/58 257/89 |
| 2014/0367711 A1* | 12/2014 | Bibl | ............... | H01L 24/73 257/89 |
| 2017/0263828 A1* | 9/2017 | Mao | ............... | H01L 33/62 |

FOREIGN PATENT DOCUMENTS

| | | |
|---|---|---|
| CN | 1790708 A | 6/2006 |
| CN | 206098390 U | 4/2017 |
| JP | 2011066227 A | 3/2011 |

\* cited by examiner

*Primary Examiner* — Didarul A Mazumder
(74) *Attorney, Agent, or Firm* — Li & Cai Intellectual Property (USA) Office

(57) ABSTRACT

An LED package structure includes a substrate and a light-emitting array. The substrate has a die bond area, and the light-emitting array is disposed in the die bond area. Each first light-emitting unit of the light-emitting array includes a first light-emitting chip and a first wavelength conversion layer of the light-emitting chip, each second light-emitting unit of the light-emitting array includes a second light-emitting chip and a second wavelength conversion layer covering the second light-emitting chip. A first light beam includes a first emission light generated by exciting the first wavelength conversion layer, and the second light beam includes a second emission light generated by exciting the second wavelength conversion layer, and the difference between the first and second emission light peak wavelengths is at least 30 nm.

16 Claims, 4 Drawing Sheets

LED PACKAGE STRUCTURE HAVING IMPROVED BRIGHTNESS

CROSS-REFERENCE TO RELATED PATENT APPLICATION

This application claims the benefit of priority to China Patent Application No. 201810989330.6, filed on Aug. 28, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an LED package structure, and more particularly to an LED package structure capable of having an improved brightness.

BACKGROUND OF THE DISCLOSURE

A light-emitting diode (LED) is a semiconductor electronic device that converts electrical energy into light energy. Light-emitting diodes are widely used in displays or lighting devices because of their high brightness, low power consumption, long life, fast start-up, high luminous efficiency, no flickering, and low tendency to cause visual fatigue.

In the field of illumination, white light is the most commonly used source color. Therefore, blue light emitting diodes are often used in combination with yellow or other mixed phosphors to produce white light. However, conventional illumination devices manufactured with light-emitting diodes still call for further improvement in brightness and luminous efficiency.

SUMMARY OF THE DISCLOSURE

In response to the above-referenced technical inadequacies, the present disclosure provides an LED package structure capable of obtaining better phosphor excitation efficiency by improving the phosphor composition of the package to obtain white light with higher brightness.

In one aspect, the present disclosure provides an LED package structure including a substrate and a light-emitting array. The substrate has a die bond area, and the light-emitting array is disposed in the die bond area. The light-emitting array includes a plurality of non-secondarily excited first light-emitting units for generating a first light beam and a plurality of non-secondarily excited second light-emitting units for generating a second light beam. The first light beam generated by the plurality of first light-emitting units is mixed with the second light beam generated by the plurality of second light-emitting units to generate white light. Each of the first light-emitting units includes a first light-emitting chip and a first wavelength conversion layer covering the first light-emitting chip, and each second light-emitting unit includes a second light-emitting chip and a second wavelength conversion layer covering the second light-emitting chip. The first light beam includes a first emission light generated by exciting the first wavelength conversion layer, and the second light beam includes a second emission light generated by exciting the second wavelength conversion layer. The peak wavelength of the first emission light and the difference between the peak wavelength of the first emission light and the peak wavelength of the second emission light is at least 30 nm.

Therefore, in the LED package structure provided by the embodiment of the present disclosure, the first light beam and the second light beam for mixing the white light are generated by using the plurality of non-secondarily excited first light-emitting units and the plurality of non-secondarily excited second light-emitting units. Since the non-secondarily excited first and second light-emitting units have higher phosphor excitation efficiency, the white light generated by the LED package structure can have a high color rendering index and a high brightness.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
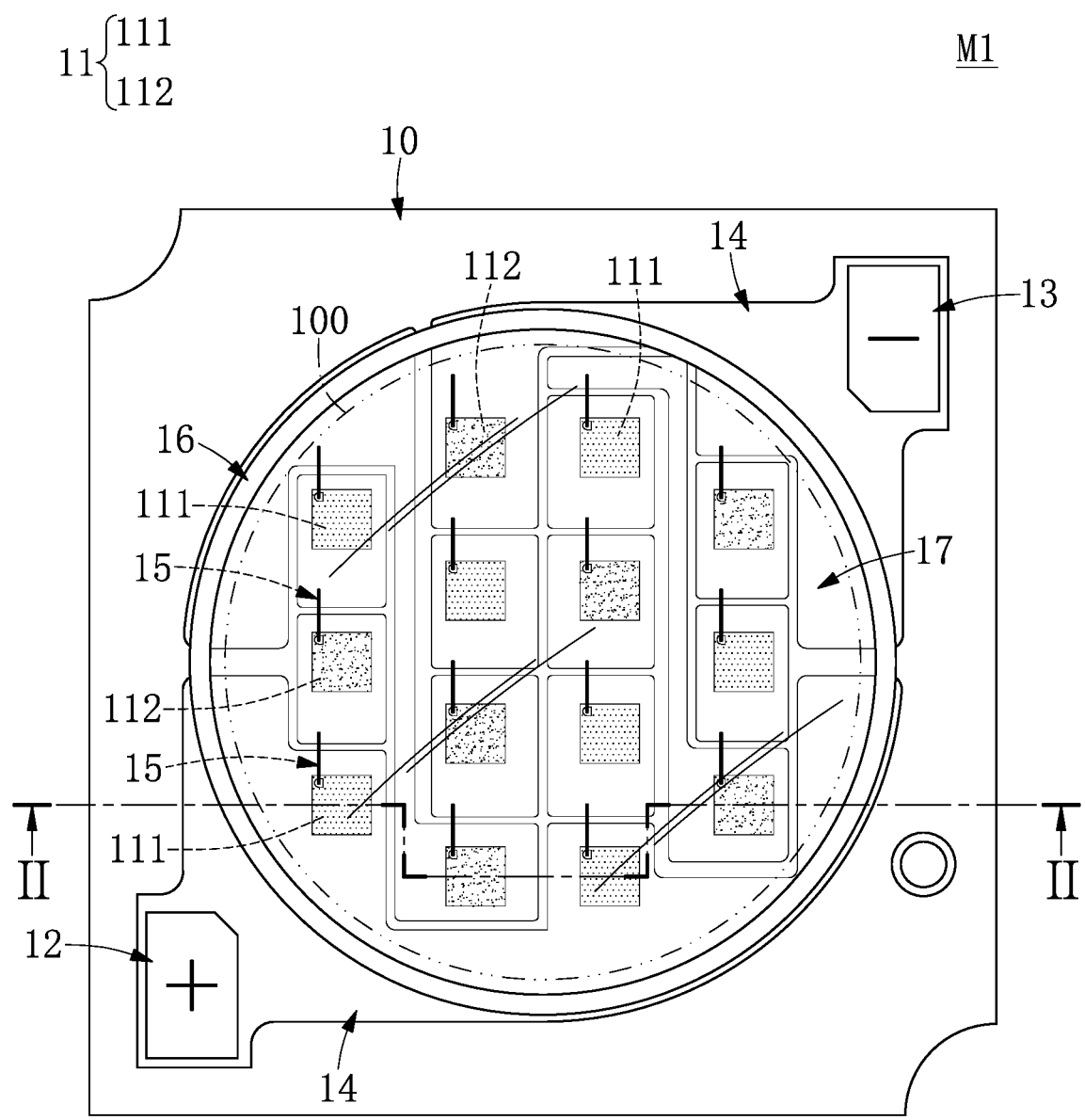
FIG. 1 is a schematic top view of an LED package structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, FIG. 1 is a schematic top view of an LED package structure according to an embodiment of the present disclosure. In the embodiment of the present disclosure, high-intensity white light is mixed by using a light beam generated by a non-secondarily excited light-emitting unit.

As shown in FIG. 1, the LED package structure M1 includes a substrate 10 and a light-emitting array 11. A die bond area 100 is defined on one of the surfaces of the substrate 10. The substrate 10 may be a substrate having high thermal conductivity, such as a ceramic substrate or a metal substrate. The light-emitting array 11 is disposed on the substrate 10 and located in the die bond area 100.

In some embodiments, the LED package structure M1 further includes a positive electrode pad 12 and a negative electrode pad 13. The positive electrode pad 12 and the negative electrode pad 13 are all disposed on the substrate 10.

The plurality of light emitting units 111 and 112 in the light-emitting array 11 can be electrically connected to a control circuit through the positive electrode pad 12 and the negative electrode pad 13. That is, the control circuit can apply currents to the plurality of light emitting units of the light-emitting array 11 through the positive electrode pad 12 and the negative electrode pad 13 to control the turning on and off of the light emitting units 111, 112. The light intensity of the white light generated by the LED package structure M1 is controlled by a current value of a current passing through the light emitting units 111, 112.

In addition, the plurality of light emitting units in the light-emitting array 11 may be connected in series to each other or in parallel with each other. In another embodiment, a portion of the light-emitting units in the light-emitting array 11 are connected in parallel with each other and in series with other light-emitting units. Therefore, the manner by which the plurality of light-emitting units in the light-emitting array 11 are mutually connected can be designed according to actual needs, and the present disclosure is not limited thereto. The light emitting unit may be a vertical light emitting unit, a flip-chip light emitting unit or a horizontal light emitting unit, and the present disclosure is not limited thereto. The plurality of light emitting units may be fixed onto the substrate 10 by a technique such as wire bonding or flip chip bonding. In the embodiment, the plurality of light emitting units are vertical light emitting units. Therefore, the circuit layer 14 can be disposed in the die bond area 100 in a predetermined manner according to the actual circuit design, so that each of the light emitting units of the light-emitting array 11 can be electrically connected to other light-emitting units through the corresponding circuit layer 14 and the corresponding conductive wire 15.

In another embodiment, the light emitting unit is a flip-chip light emitting unit, and can be fixed onto the substrate 10 by flip chip bonding. At this time, the LED package structure M1 does not necessarily include the conductive wire 15.

In some embodiments, the light-emitting array 11 includes a plurality of first light-emitting units 111 for generating a first light beam, and a plurality of second light-emitting units 112 for generating a second light beam. The first light beam generated by the plurality of first light-emitting units 111 and the second light beams generated by the plurality of second light-emitting units 112 are mixed with each other to generate white light.

Figure 2:
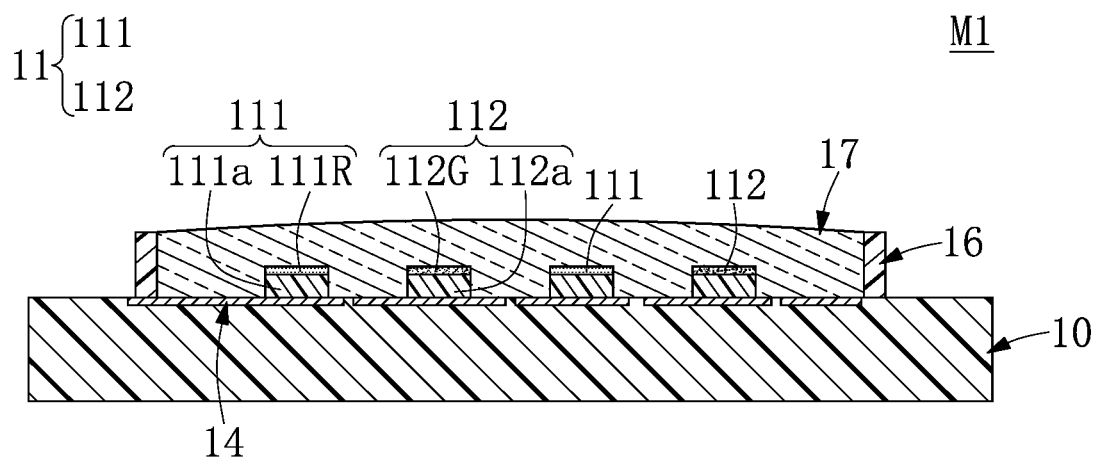
FIG. 2 is partial cross-sectional view of the LED package structure taken along line II-II of FIG. 1.

Referring to FIG. 2, FIG. 2 is partial cross-sectional view of the LED package structure taken along line II-II of FIG. 1. Each first light-emitting unit 111 includes a first light-emitting chip 111a and a first wavelength conversion layer 111R covering the first light-emitting chip 111a. Each second light-emitting unit 112 includes a second light-emitting chip 112a and a second wavelength conversion layer 112G covering the second light-emitting chip 112a.

Both the first light-emitting chip 111a and the second light-emitting chip 112a are used to generate a emission light, and the emission light is blue light or violet light. That is, the first light-emitting chip 111a and the second light-emitting chip 112a may be a blue light LED chip or a violet light LED chip.

Specifically, the first light-emitting chip 111a and the second light-emitting chip 112a may both be blue light LED chips, or may both be violet light LED chips, or a combination of the blue light LED chip and the violet light LED chip.

In one embodiment, when the emission light is blue light, the peak wavelength of the emission light is between 420 nm and 470 nm, and the peak wavelength of the commonly used blue light is between 445 nm and 455 nm. When the emission light is violet, the peak wavelength of the emission light is between 380 nm and 420 nm.

In addition, the first light-emitting chip 111a and the second light-emitting chip 112a may be selected as a vertical chip, a flip chip, or a horizontal chip. In some embodiments, the first light-emitting chip 111a and the second light-emitting chip 112a are vertical chips.

One of the methods of forming the first wavelength conversion layer 111R and the second wavelength conversion layer 112G is mixing the phosphor and the glue in a certain ratio, and then applying the first light-emitting chip 111a and the second light-emitting chip 112a. In other embodiments, the first wavelength conversion layer 111R and the second wavelength conversion layer 112G are both phosphor sheets, such as phosphor glass and phosphor ceramic. Therefore, the fluorescent film patch can be directly attached to the first light-emitting chip 111a and the second light-emitting chip 112a.

In addition, in the embodiment of FIG. 2, the first wavelength conversion layer 111R covers only the top surface of the first light-emitting chip 111a to expose the side surface of the first light-emitting chip 111a. Similarly, the second wavelength conversion layer 112G covers only the top surface of the second light-emitting chip 112a to expose the side surface of the second light-emitting chip 112a. However, in other embodiments, it may be that only the first wavelength conversion layer 111R (or the second wavelength conversion layer 112G) covers the top surface of the first light-emitting chip 111a (or the second light-emitting chip 112a) to expose the side surface of the first light-emitting chip 111a (or the side surface of the second light-emitting chip 112a).

Figure 3:
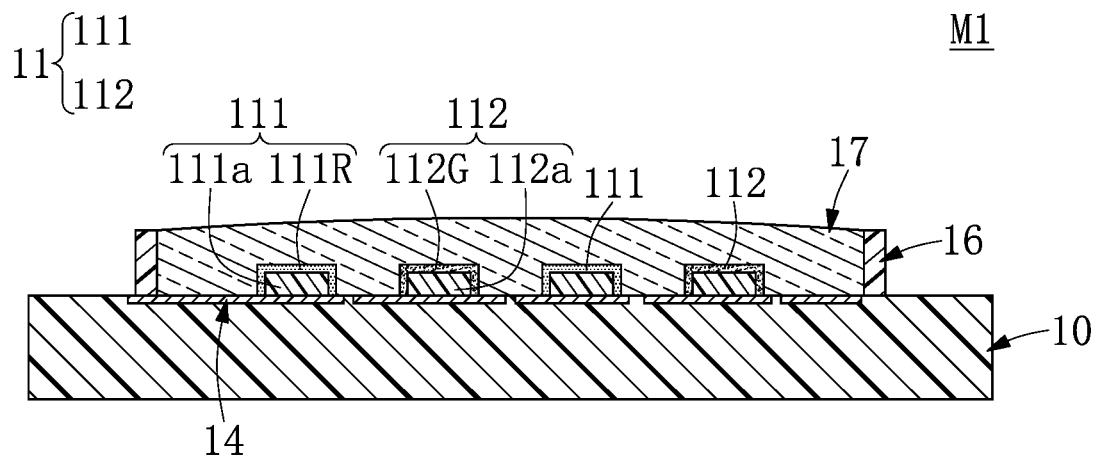
FIG. 3 is a partial cross-sectional view showing an LED package structure according to another embodiment of the present disclosure.

Referring to FIG. 3, in another embodiment, the first wavelength conversion layer 111R and the second wavelength conversion layer 112G completely cover the top surface and all side surfaces of the first light-emitting chip 111a and the second light-emitting chip 112a, respectively. In another embodiment, only the wavelength conversion layer of one of the light emitting units completely covers the top surface and all side surfaces of the light emitting chip.

It should be noted that in the related art, different mixed phosphors are excited by violet light or blue light to generate a plurality of composite colors to be mixed into white light. The mixed phosphor may contain a green phosphor mixed with a red phosphor at a predetermined concentration ratio.

However, some of the red phosphor may be excited by green light produced by the green phosphor, reducing the light efficiency. In addition, the proportion of green light in the composite color light is also reduced, thereby reducing the color rendering index and brightness of white light.

Accordingly, in some embodiments, the first wavelength conversion layer 111R and the second wavelength conversion layer 112G are both single color phosphor layers to avoid the above-mentioned problems. The first wavelength conversion layer 111R can absorb the emission light to produce the first emission light, thereby causing the first light-emitting unit 111 to generate a first light beam. The second wavelength conversion layer 112G can absorb the emission light to generate second emission light, thereby causing the second light-emitting unit 112 to generate the aforementioned second light beam. In other words, the first light beam contains at least the first emission light, and the second light beam contains at least the second emission light.

In one embodiment, the difference between the peak wavelength of the first emission light and the peak wavelength of the second emission light is at least 30 nm. In some embodiments, the difference between the peak wavelength of the first emission light and the peak wavelength of the second emission light may be 40 nm or more, 50 nm or more, or even 85 nm or more. For example, the first emission light can be red-orange light, or a peak wavelength of the first emission light can be between 580 nm and 675 nm. The second emission light is a yellow-green light, or a peak wavelength of the second emission light can be between 515 nm and 570 nm.

Accordingly, the first wavelength conversion layer 111R may include one or more red phosphors for exciting the first emission light having a peak wavelength ranging from 580 nm to 675 nm. Further, the first wavelength conversion layer 111R may include only one type of red phosphor, and may be used to excite red light having a specific wavelength, or may also include two or more types of red phosphors, and may be used to excite red lights with different wavelengths, which is, for example, another red light having a wavelength of 620 nm and still another red light having a wavelength of 630 nm. Additionally, the second wavelength conversion layer 112G may include one or more green phosphors for exciting the second emission light having a peak wavelength falling between 515 nm and 570 nm.

The conversion efficiency of the phosphors in the first wavelength conversion layer 111R having a single color system and the second wavelength conversion layer 112G having a single color system is also higher than that of the wavelength conversion layer using the mixed color phosphors.

Since the emission light passing through the first wavelength conversion layer 111R is not necessarily completely converted into the first emission light, the first light beam may contain part of the emission light aside from the first emission light. Similarly, the second light beam may contain the second emission light and a part of the emission light.

White light can be formed by mixing the first light beam with the second light beam. Specifically, in the embodiment of the present disclosure, the ratio of the first emission light (for example, red light), the second emission light (for example, green light), and the emission light (for example, blue light or violet light) can be controlled to form white light with higher brightness and color rendering index.

Further, as can be seen from the photopic vision function, a light having a wavelength of 555 nm has a highest luminance. Therefore, green light would contribute significantly to the brightness of white light. In one embodiment, in order make the white light contain a higher proportion of green light, the green phosphor in the second wavelength conversion layer 112G is excited as much as possible to increase the proportion of the second emission light in the second light beam.

When the emission light is blue light, a transmittance of the emission light to the second wavelength conversion layer 112G is between 0% and 16%. Transmittance is a ratio of the remaining emission light spectrum after the emission light excites the phosphor, which can be controlled by adjusting a concentration and content of a corresponding phosphor according to the emission efficiency of a selected phosphor to the emission light. In other words, most of the emission light passing through the second wavelength conversion layer 112G is absorbed by the green phosphor layer to generate green light, so that the white light has a higher brightness.

In addition, the ratio of the first emission light to the emission light in the first light beam can be adjusted according to the desired color rendering index and color temperature. In one embodiment, when the emission light is blue light, the transmittance of the emission light to the first wavelength conversion layer 111R is between 10% and 85%. For example, if a white light having a high color temperature is to be obtained, the emission light should have a higher transmittance to the first wavelength conversion layer 111R, so that the first light beam contains a higher proportion of blue light. If a white light having a low color temperature is to be obtained, the emission light should have a lower transmittance to the first wavelength conversion layer 111R, so that the first light beam contains a lower proportion of blue light.

Referring again to FIG. 1, the ratio between the number of first light-emitting units 111 and the number of second light-emitting units 112 may be between 0.5 and 1. The number of first light-emitting units 111 and the number of second light-emitting units 112 can be adjusted according to actual needs. The white light mixed by using the first light-emitting unit 111 and the second light-emitting unit 112 has a color rendering index of at least more than 80, and preferably 90 or more. In addition, compared to the white light with a color rendering index of 90 by using a light-emitting unit with a mixed phosphor, the white light mixed by the non-secondarily excited first light-emitting unit 111 and the second light-emitting unit 112 can not only have the color rendering index reach 90, but also have the brightness increased by 10% to 12%.

It should be noted that, in some embodiments, any two first light-emitting units 111 located on the outermost circle of the light-emitting array 11 are not adjacent to each other, and any two second light-emitting units 112 located on the outermost circle of the light-emitting array 11 are also not adjacent to each other.

That is, among the plurality of light-emitting units located at the outermost circle of the light-emitting array 11, between the two light-emitting units for generating the emission light (such as red light or orange light) having the same or similar peak wavelengths, another light-emitting unit is provided to generate another emission light (such as green light). In this way, the white light generated by the LED package structure M1 near the edge of the die bond area 100 can be prevented from having a partially reddish or partially greenish hue.

Further, in some embodiments, the plurality of first light-emitting units 111 and the plurality of second light-emitting units 112 located at the outermost circle of the light-emitting array 11 are alternately disposed. That is, the two outermost rows located in the light-emitting array 11, and the plurality of first light-emitting units 111 and the plurality of second light-emitting units 112 located at the front and rear ends of each column are alternately arranged.

Referring to FIG. 1 and FIG. 2, the LED package structure M1 of the embodiment of the present disclosure further includes a retaining wall 16 and a light-transmissive protective layer 17 limited in place by the retaining wall 16. The retaining wall 16 surrounding the light-emitting array 11 is disposed on the substrate 10, and the die bond area 100 and the light-emitting array 11 are both covered by the light-transmissive protective layer 17. The light-transmissive protective layer 17 may be a translucent glue or a translucent glue mixed with a diffusion powder.

Figure 4:
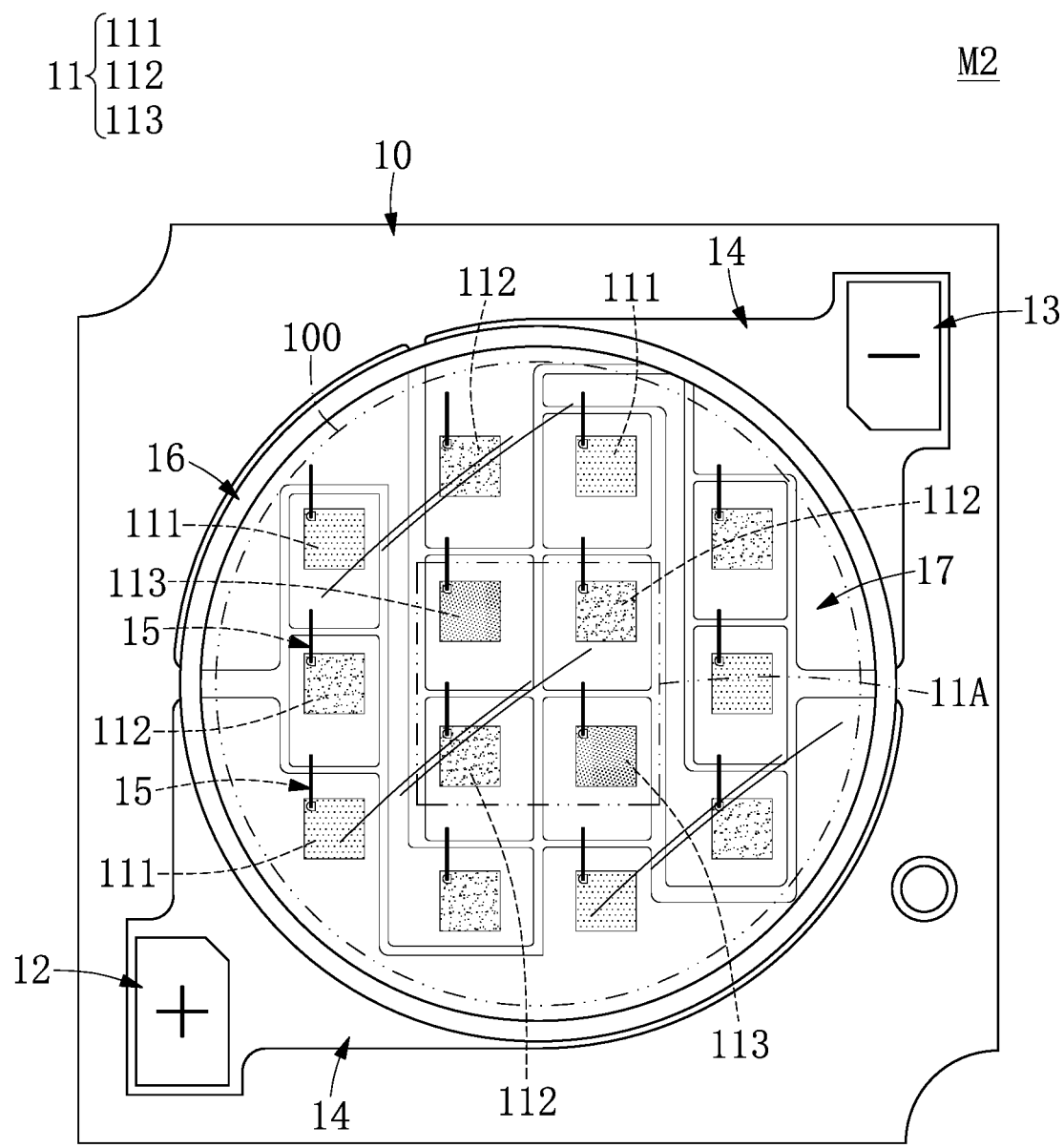
FIG. 4 is a schematic top view of the LED package structure according to still another embodiment of the present disclosure.

Referring to FIG. 4, FIG. 4 is a schematic top view of the LED package structure according to still another embodiment of the present disclosure. Similar elements of the LED package structure M2 of the present embodiment and the LED package structure M1 of FIG. 1 have the same reference numerals.

In some embodiments, in addition to the plurality of first light-emitting units 111 and the plurality of second light-emitting units 112, the light-emitting array 11 further includes a plurality of third light-emitting units 113 for generating a third light beam.

The structure of the third light-emitting unit 113 can be similar to that of the first light-emitting unit 111 described in FIG. 2 or 3. That is, each third light-emitting unit 113 includes a third light-emitting chip (not shown) and a third wavelength conversion layer (not shown) covering the third light-emitting chip. The emission light generated by the third light-emitting chip is violet light. In some embodiments, the first wavelength conversion layer 111R is a red phosphor layer, the second wavelength conversion layer 112G is a green phosphor layer, and the third wavelength conversion layer is a blue phosphor layer. Accordingly, the third wavelength conversion layer can absorb the emission light to produce third emission light. In some embodiments, the third emission light is blue light and the peak wavelength is between 440 nm and 480 nm.

That is, the first emission light, the second emission light, and the third emission light are red, green, and blue light, respectively. White light can be generated by mixing the first light beam, the second light beam, and the third light beam.

In one embodiment, the color temperature of the white light may be adjusted according to the ratio between the first light-emitting unit 111, the second light-emitting unit 112, and the third light-emitting unit 113.

Further, as shown in FIG. 4, in the light-emitting array 11 of the present embodiment, the number of the third light-emitting units 113 may be smaller than the number of the first light-emitting units 111 and the number of the second light-emitting units 112. The main reason is that the blue phosphor in the third wavelength conversion layer is excited by violet light, so that a higher proportion of blue light generated, such that the number of the third light-emitting units 113 is the least among the three, which can avoid generating white light with high color temperature (more than 10000K). In addition, the number of first light-emitting units 111 may be smaller than the number of second light-emitting units 112 so that the white light that is ultimately mixed can have higher brightness.

In addition, by adjusting the transmittance of the emission light to the first wavelength conversion layer 111R, the second wavelength conversion layer 112G, and the third wavelength conversion layer, the color temperature, color rendering index, and brightness of white light can be further fine-tuned.

In one embodiment, the emission light is violet light and the transmittance of the emission light to the second wavelength conversion layer 112G is between 0% and 8%. In addition, the transmittance of the emission light to the third wavelength conversion layer is between 0% and 5%. As for the transmittance of the emission light to the first wavelength conversion layer 111R, the transmittance can be adjusted according to the color temperature to be obtained and the color rendering index. In one embodiment, the white light obtained by mixing the first light beam, the second light beam and the third light beam has a color rendering index of at least 80, and preferably 90.

In some embodiments, any two first light-emitting units 111 located at the outermost circle of the light-emitting array 11 are not adjacent to each other, and any two second light-emitting units 112 located at the outermost circle of the light-emitting array 11 are also not adjacent to each other. Therefore, a second light-emitting unit 112 or a third light-emitting unit 113 may be disposed between any two first light-emitting units 111 located at the outermost circle of the light-emitting array 11. Similarly, between the two second light-emitting units 112 located at the outermost circle of the light-emitting array 11, a first light-emitting unit 111 or a third light-emitting unit 113 may be provided.

In some embodiments, a plurality of first light-emitting units 111 and a plurality of second light-emitting units 112 located at the outermost circle of the light-emitting array 11 are also alternately arranged to avoid localized color shift (reddish or greenish) of white light mixed near the edge of the die bond area 100.

As shown in FIG. 4, two of the first light-emitting units 111 are configured together with two of the third light-emitting units 113 to form a 2×2 sub-array 11A. The two first light-emitting units 111 in the 2×2 sub-array 11A are arranged along one of the diagonal lines, and the two third light-emitting units 113 in the 2×2 sub-array 11A are arranged along the other diagonal.

In another embodiment, the two first light-emitting units 111 in the 2×2 sub-array 11A may also be replaced by two second light-emitting units 112, or one of the first light-emitting units 111 of the 2×2 sub-array 11A may be replaced with the second light-emitting unit 112 to generate white light having a predetermined color rendering index and brightness.

With the above arrangement, the first light beam, the second light beam, and the third light beam generated by the plurality of first light-emitting units 111, the plurality of second light-emitting units 112, and the plurality of third light-emitting units 113 can be uniformly mixed.

Figure 5:
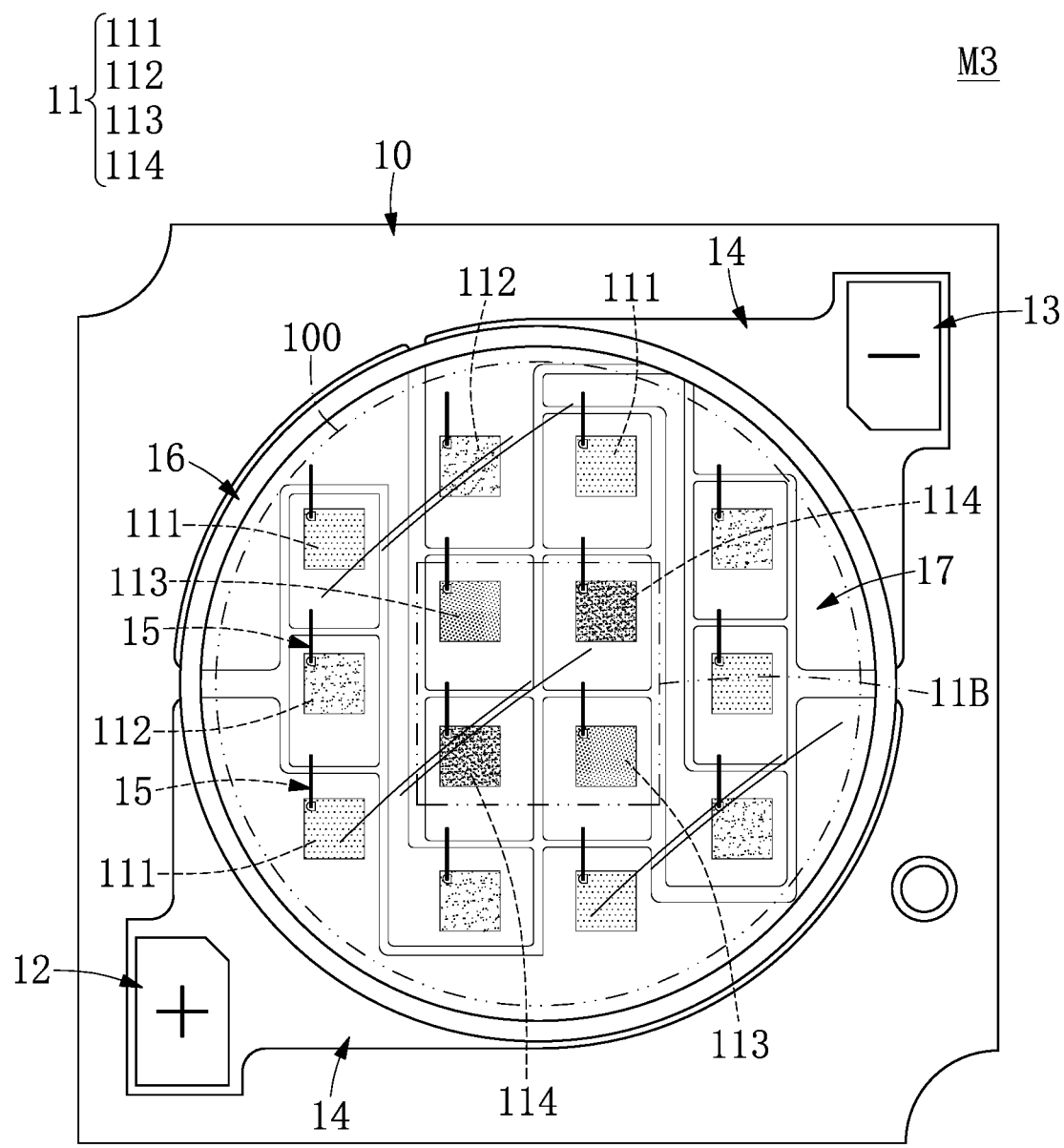
FIG. 5 is a schematic top view of the LED package structure according to yet another embodiment of the present disclosure.

It should be noted that FIG. 4 only shows one embodiment, and the present disclosure is not limited to the arrangement of the plurality of first light-emitting units 111, the plurality of second light-emitting units 112, and the plurality of third light-emitting units 113. Referring to FIG. 5, FIG. 5 is a schematic top view of the LED package structure according to yet another embodiment of the present disclosure. Similar elements of the LED package structure M3 of the present embodiment and the LED package structure M1 of FIG. 1 have the same reference numerals.

In some embodiments, in addition to the plurality of first light-emitting units 111, the plurality of second light-emitting units 112, and the plurality of third light-emitting units 113, the light-emitting array 11 further includes a plurality of fourth light-emitting units 114 for generating a fourth light beam.

The structure of the fourth light-emitting units 114 can be similar to that of the first light-emitting units 111 described in FIG. 2 or FIG. 3. That is, each of the fourth light-emitting units 114 includes a fourth light-emitting chip (not shown) and a fourth wavelength conversion layer (not shown) covering the fourth light-emitting chip. The emission light generated by the fourth light-emitting chip is blue light or violet light.

Accordingly, in some embodiments, the first wavelength conversion layer 111R is a red phosphor layer generating a first emission light having a peak wavelength between 605 nm and 675 nm. The fourth wavelength conversion layer is an orange phosphor layer. In some embodiments, the fourth light beam includes a fourth emission light generated by exciting a fourth wavelength conversion layer, the fourth emission light is orange light, and the peak wavelength is between 580 nm and 605 nm.

In addition, in some embodiments, the two third light-emitting units 113 and the two fourth light-emitting units 114 are configured together as a 2×2 sub-array 11B. Two third light-emitting units 113 of 2×2 sub-array 11B are arranged along one of the diagonal lines, and two fourth light-emitting units 114 of 2×2 sub-array 11B are arranged along the other diagonal line. In other embodiments, one of the two fourth light-emitting units 114 of the 2×2 sub-array 11B may also be replaced by a first light-emitting unit 111 or a second light-emitting unit 112.

It should be noted that the light-emitting array 11 of the embodiment of the present disclosure may further include a light-emitting unit for generating other kinds of light beams, for example, a light-emitting unit for generating white light or a light-emitting unit for generating yellow light. The light emitting unit for generating white light may include a blue light LED chip and a yellow phosphor layer. Accordingly, the present disclosure is not limited to the type of the light-emitting unit as long as the wavelength conversion layer used in the light-emitting unit is a single-color phosphor layer (not limited to a single-wavelength phosphor) that does not cause secondary excitation.

In conclusion, by using a plurality of light emitting units including a non-secondarily excited first light-emitting unit 111 and a second light-emitting unit 112 to respectively generate a first light beam and a second light beam, the present disclosure has the advantage that white light can be mixed to have a high color rendering index and high brightness.

Further, the wavelength conversion layer of each of the light-emitting units for mixing white light in the present disclosure is a single-color phosphor compared to a technique of using a mixed phosphor to generate a composite color light and then combining the mixed color light to form white light. When the monochromatic phosphor layer is excited by the emission light, most of the phosphor can be excited by the emission light to improve the use efficiency of the phosphor. Since the non-secondarily excited light-emitting unit has higher phosphor excitation efficiency, the white light generated by the LED package structure can have higher brightness and a high color rendering index.

In addition, in some embodiments of the present disclosure, the uniformity of the mixed light can be increased by appropriately arranging the positions of the various light emitting units. Among the plurality of light-emitting units located at the outermost circle of the light-emitting array 11, any two light-emitting units for generating the same emission light (for example, red light) are not adjacent to each other, and the light beams near the edge of the die bond area can be mixed uniformly to avoid color shift of the white light generated by the LED package structure M1~M3 near the edge of the die bond area 100.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED package structure, comprising:
a substrate having a die bond area; and
a light-emitting array disposed in the die bond area, wherein the light-emitting array includes a plurality of non-secondarily excited light-emitting units, and the plurality of non-secondarily excited light-emitting units includes at least a plurality of non-secondarily excited first light-emitting units for generating a first light beam and a plurality of non-secondarily excited second light-emitting units for generating a second light beam;
wherein each of the plurality of non-secondarily excited first light-emitting units includes a first light-emitting chip and a first wavelength conversion layer covering the first light-emitting chip, and each of the plurality of non-secondarily excited second light-emitting units includes a second light-emitting chip and a second wavelength conversion layer covering the second light-emitting chip; the first light beam includes a first emission light generated by exciting the first wavelength conversion layer, the second light beam includes a second emission light generated by exciting the second wavelength conversion layer;
wherein the plurality of non-secondarily excited first light-emitting units and the plurality of non-secondarily excited second light-emitting units are jointly arranged to form an outermost circle of the light-emitting array, each one of the plurality of non-secondarily excited first light-emitting units is arranged between any two ones of the plurality of non-secondarily excited second light-emitting units, and each one of the plurality of non-secondarily excited second light-emitting units is arranged between any two ones of the plurality of non-secondarily excited first light-emitting units;
wherein any two adjacent ones of the plurality of non-secondarily excited light-emitting units respectively generate different light beams having different peak wavelengths; and wherein the plurality of non-secondarily excited first light-emitting units and the plurality of non-secondarily excited second light-emitting units located on the outermost circle of the light-emitting array are alternately arranged.

2. The LED package structure according to claim 1, wherein the first emission light has a peak wavelength between 580 nm and 675 nm, and the second emission light has a peak wavelength between 520 nm and 565 nm.

3. The LED package structure according to claim 2, wherein the ratio between the number of the first light-emitting units and the number of the second light-emitting units is between 0.5 and 1, and a white light has a color rendering index of 80.

4. The LED package structure according to claim 2, wherein the first light-emitting chip and the second light-emitting chip are both used to generate an emission light, and the emission light is blue light or violet light.

5. The LED package structure according to claim 2, wherein a transmittance of an emission light to the second wavelength conversion layer is between 0% and 16%.

6. The LED package structure according to claim 2, wherein the light-emitting array further includes a plurality of non-secondarily excited third light-emitting units for generating a third light beam, each of the third light-emitting units includes a third light-emitting chip and a third wavelength conversion layer covering the third light-emitting chip, the third light beam includes a third emission light generated by exciting the third wavelength conversion layer, and a peak wavelength of the third emission light is between 440 nm and 480 nm.

7. The LED package structure according to claim 6, wherein the number of the third light-emitting units is smaller than the number of the first light-emitting units and is smaller than the number of the second light-emitting units.

8. The LED package structure according to claim 6, wherein the first wavelength conversion layer is a red phosphor layer or an orange phosphor layer, the second wavelength conversion layer is a green phosphor layer, the transmittance of the emission light to the second wavelength conversion layer is between 0% and 8%, and the transmittance of the emission light to the third wavelength conversion layer is between 0% and 5%.

9. The LED package structure according to claim 6, wherein the light-emitting array further includes a plurality of fourth light-emitting units for generating a fourth light-emitting unit, and each of the fourth light-emitting units includes a fourth light-emitting chip and a fourth wavelength conversion layer covering the fourth light-emitting chip; wherein the first wavelength conversion layer is a red phosphor layer, and the fourth wavelength conversion layer is an orange phosphor layer.

10. The LED package structure according to claim 6, wherein the light-emitting array further includes a plurality of fourth light-emitting units for generating a fourth light-emitting unit, and each of the fourth light-emitting units includes a fourth light-emitting chip and a fourth wavelength conversion layer covering the fourth light-emitting chip; wherein the first wavelength conversion layer is a red phosphor layer, and the fourth wavelength conversion layer is an orange phosphor layer.

11. The LED package structure according to claim 1, wherein the first wavelength conversion layer covers a top surface of the first light-emitting chip to expose a side surface of the first light-emitting chip.

12. The LED package structure according to claim 1, wherein the first wavelength conversion layer completely covers the first light-emitting chip.

13. The LED package structure according to claim 1, wherein the LED package structure further comprises a retaining wall surrounding the light-emitting array and a light-transmissive protective layer limited in place by the retaining wall; the die bond area and the light-emitting array are covered by the light-transmissive protective layer.

14. The LED package structure according to claim 1, wherein the first light-emitting chip and the second light-emitting chip are vertical chips.

15. The LED package structure according to claim 1, wherein any two of the first light-emitting units located on the outermost circle of the light-emitting array are not adjacent, and any two of the second light-emitting units located on the outermost circle of the light-emitting array are not adjacent.

16. An LED package structure, comprising:
a substrate having a die bond area; and
a light-emitting array disposed in the die bond area, wherein the light-emitting array includes a plurality of non-secondarily excited first light-emitting units for generating a first light beam and a plurality of non-secondarily excited second light-emitting units for generating a second light beam;
wherein each of the plurality of non-secondarily excited first light-emitting units includes a first light-emitting chip and a first wavelength conversion layer covering the first light-emitting chip, and each of the plurality of non-secondarily excited second light-emitting units includes a second light-emitting chip and a second wavelength conversion layer covering the second light-emitting chip; the first light beam includes a first emission light generated by exciting the first wavelength conversion layer, the second light beam includes a second emission light generated by exciting the second wavelength conversion layer, wherein the second emission light has a peak wavelength ranging between 515 nm and 570 nm;
wherein a ratio of a number of the first light-emitting units to a number of the second light-emitting units is less than 1; and
wherein the plurality of non-secondarily excited first light-emitting units and the plurality of non-secondarily excited second light-emitting units are jointly arranged to form an outermost circle of the light-emitting array, any two of the first light-emitting units located on the outermost circle of the light-emitting array are not adjacent, and any two of the second light-emitting units located on the outermost circle of the light-emitting array are not adjacent.

* * * * *